(12) United States Patent
Oosawa et al.

(10) Patent No.: US 6,372,620 B1
(45) Date of Patent: Apr. 16, 2002

(54) FABRICATION METHOD OF WIRING SUBSTRATE FOR MOUNTING SEMICONDUCTOR ELEMENT AND SEMICONDUCTOR DEVICE

(75) Inventors: Kenji Oosawa, Kanagawa; Tomoo Iijima, Tokyo; Hidetoshi Kusano, Kanagawa, all of (JP)

(73) Assignees: Sony Corporation, Tokyo (JP); North Corporation, Tokyo (JP)

( * ) Notice: Subject to any disclaimer, the term of this patent is extended or adjusted under 35 U.S.C. 154(b) by 0 days.

(21) Appl. No.: 09/253,441

(22) Filed: Feb. 19, 1999

(30) Foreign Application Priority Data

Feb. 20, 1998 (JP) ............................. 10-038316

(51) Int. Cl.⁷ ...................... H01L 21/44; H01L 21/302
(52) U.S. Cl. ...................... 438/612; 438/613; 438/614; 438/674; 438/737; 438/738; 438/740; 438/742; 438/751; 438/754
(58) Field of Search ................................ 438/612–614, 438/611, 617, 459, 678, 461, 464, 735–740, 111, 123, 118, 734, 742, 674, 749–751, 754; 257/666–677, 673, 676

(56) References Cited

U.S. PATENT DOCUMENTS 6,077,727 A * 6/2000 Osawa et al. ............... 438/123

OTHER PUBLICATIONS

Patent Abstracts of Japan, vol. 11 No. 4(E–468) (2451), Jan. 7, 1987, for Application No. 59–190959.

* cited by examiner

Primary Examiner—Ha Tran Nguyen
(74) Attorney, Agent, or Firm—Sonnenschein, Nath & Rosenthal

(57) ABSTRACT

By adopting an electrolytic plating method in forming the bump, the drawbacks of the conventional electrolytic plating method should be avoided. For example, the necessity of adopting a lead wiring for each wiring or the like should be eliminated. On the surface of a metal base, a resist film (first resist film) having a negative pattern for forming a wiring film and a resist film (second resist film) having a negative pattern for forming the bump or the pad is formed. By using these films as masks, electrolyic plating of a bump material film is conducted to form the bump. Subsequently, after only the second film is removed. By using the first resist film as a mask, electrolytic plating is then conducted to form a wiring film.

7 Claims, 12 Drawing Sheets

F I G. 5A
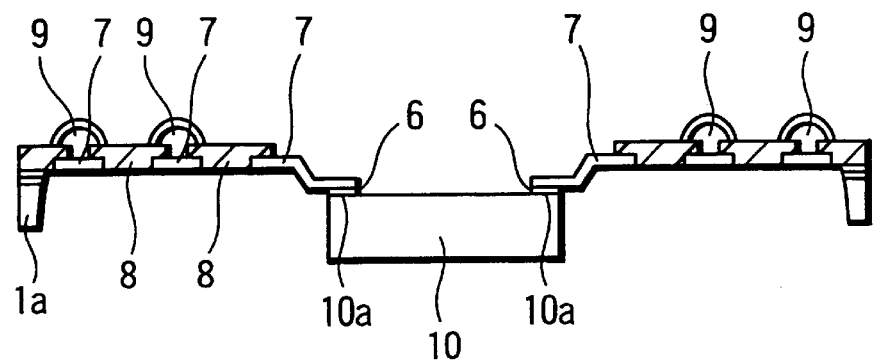
F I G. 5B
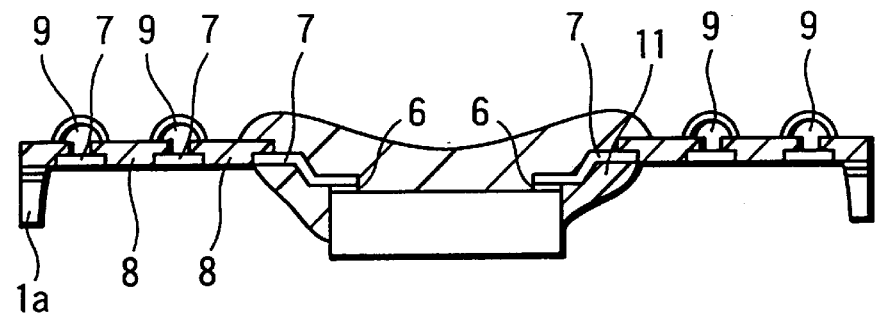
F I G. 5C
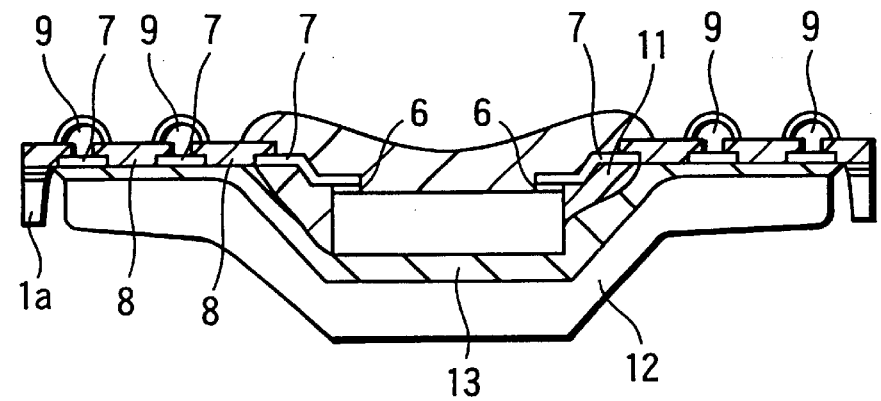

FABRICATION METHOD OF WIRING SUBSTRATE FOR MOUNTING SEMICONDUCTOR ELEMENT AND SEMICONDUCTOR DEVICE

BACKGROUND OF THE INVENTION

1. Field of the Invention

The present invention relates to a fabrication method of a wiring substrate for mounting a semiconductor element.

2. Description of the Related Art

As one of techniques for mounting a semiconductor element, there is a TAB (Tape Automated Bonding) technique. FIGS. 1A through 1D show the outline of a wiring substrate forming method which is one conventional example thereof in the order of process. For example, to a polyimide resin layer a (having a thickness of, for example, 75 $\mu$m) patterned to have a predetermined pattern, a copper layer c (having a thickness of, for example, several to several tens $\mu$m) is bonded via an adhesive b to form a stacked layer. The copper layer c is patterned. As a result, a film circuit having a wiring film formed therein is prepared. FIG. 1A shows its film circuit.

Subsequently, as shown in FIG. 1B, a nickel film (having a thickness of, for example, 2 $\mu$m) is first formed by electrolytic plating. Thereafter, a gold plating film (having a thickness of, for example, 1 $\mu$m) is formed by electrolytic plating. Thereafter, as shown in FIG, 1C, external shape cut processing is conducted to separate the same at every semiconductor device independently. Reference numeral d denotes a plating film.

After the external shape cut processing, an internal end of each wiring film c is bonded to respective electrodes of a semiconductor element e as shown in FIG. 1D. This bonding becomes Au/Al bonding.

FIGS. 2A through 2C show the outline of a wiring substrate forming method which is another conventional example in the order of process. This conventional example is intended for a wiring substrate for BGA/CSP of wire bonding type, and a bump is formed by using nonelectrolytic plating. First of all, as shown in FIG. 2A, a polyimide resin layer a (having a thickness of, for example, 30 $\mu$m) with a patterned adhesive b is bonded to a copper layer c (having a thickness of, for example, 18 $\mu$m)) to form a stacked layer. Thereafter, as shown in FIG. 2B, the copper layer c is selectively etched. Then, as shown in FIG. 2C, a nickel film (having a film thickness of 2 $\mu$m) is then formed on the whole surface by nonelectrolytic plating. Further, a golden film (0.5 $\mu$m) is formed on the nickel film by the nonelectrolytic plating to form a nickel/gold plating film d. Thereafter, a semiconductor element is subjected to die bonding, wire bonding is carried out, and then resin sealing is performed to form a seal layer. FIG. 2C shows its state after resin sealing, where d denotes a nickel/gold plating film, e a semiconductor element, g an adhesive, h a wire, and i a sealing resin.

In the conventional method shown in FIG. 1, a golden film is formed by the electrolytic plating at every wiring. This results in a first problem that a lead wiring is needed for the electrolytic plating and the design is troublesome. Secondly, there is a problem that a size reduction thereof is difficult because the lead wiring area is needed. Thirdly, since partial plating is difficult by the electrolytic plating, gold sticks to the whole surface where the wiring is exposed, and the amount of use of gold tends to increase. This results in a problem that the gold film cannot be too thick in order to suppress that tendency. This becomes a factor restraining the improvement of the bonding performance. Fourthly, in the case where a bump is configured by forming a gold film directly on the surface of a copper film serving as a wiring film, for example, a nickel film is required as an underlayer of the gold bump in order to prevent ultrasonic vibration applied at the time of bonding from spreading. This results in a problem that damage tends to occur on the semiconductor device side.

Furthermore, in the conventional method shown in FIG. 2, since the gold film is formed by using the nonelectrolytic plating method, first, the plating speed is slow and the time required for plating becomes very long. Furthermore, in the case where a substrate for TAB is formed, tapelike plating facilities become necessary. This results in a problem that the cost of facilities becomes high. Secondly, the nonelectrolytic plating method has a problem that the gold plating for an opening having a small diameter is difficult and blurring of the adhesive and occurrence of bubbles easily occur. Thirdly, the nonelectrolytic plating method has a problem that the stability of plating is poor, the film quality is unstable, and an abnormality easily occurs in the gold film. Fourthly, the nonelectrolytic plating method has a problem that the replacement frequency of the plating solution is high and replacement is needed at a frequency of once every three or four days.

SUMMARY OF THE INVENTION

The present invention has been made to solve such problems. An object of the present invention is to avoid drawbacks of the conventional electrolytic plating method in a fabrication method of a wiring substrate for mounting a semiconductor element by adopting the electrolytic plating method in forming a bump or a bonding pad and thereby eliminating the necessity of forming a lead wiring at every wiring while avoiding the drawbacks of the above described non-electrolytic plating method.

A fabrication method of a wiring substrate for mounting a semiconductor element according to a first aspect of the present invention includes forming a resist film (first resist film) of a negative pattern for forming a wiring film and a resist film (second resist film) of a negative pattern for forming a bump or a pad on a surface of a metal base, conducting electrolytic plating of a bump or pad material by using the first resist film and the second resist film as a mask, thereby forming a bump or a pad, then removing only the second resist film, and forming a wiring film by conducting electrolytic plating with the first resist film serving as a mask.

According to the fabrication method of the wiring substrate for mounting a semiconductor element according to the first aspect, therefore, in a stage before the wiring film is formed, plating is conducted by using the resist film having a negative pattern with respect to the wiring film and the resist film having a negative pattern with respect to the bump or pad as masks, and thereby the bump or pad is formed. At the time of that plating, therefore, the metal base can be used as a potential transmission means. Without providing a lead circuit for electrolytic plating, therefore, the bump or pad can be formed by the electrolytic plating. Therefore, all drawbacks of the method of forming the bump or pad by using the nonelectrolytic plating can be avoided. In addition, the necessity of forming the electrolytic plating lead circuit for providing a potential at every wiring film when using the electrolytic plating method is not present, either. Therefore, the drawback of conventional electrolytic plating method can be avoided.

A fabrication method of a wiring substrate for mounting a semiconductor element according to a second aspect of the present invention includes conducting electrolytic plating of a bump or pad material on a surface of a metal base by using a resist film having a negative pattern with respect to a wiring film to be formed, as a mask, thereby forming a bump or a pad, furthermore conducting electrolytic plating of a wiring film material on the pad on the surface of the metal base by using the resist film as a mask, and thereby forming a wiring film.

According to the fabrication method of a wiring substrate for mounting a semiconductor element according to the second aspect, therefore, the resist film formed as the mask for selectively forming the wiring film is used as the mask for selectively forming the bump or pad as well. Both the formation of the bump or the pad and formation of the wiring film are conducted in such a state that the metal base is surely present. At the a time of that plating, therefore, the metal base can be used as a potential transmission means. Without providing a lead circuit for electrolytic plating, therefore, the bump or the pad can be formed by the electrolytic plating. Therefore, all drawbacks of the method of forming the bump or pad by using the nonelectrolytic plating can be avoided. In addition, the necessity of forming the lead circuit for electrolytic plating for providing a potential at every wiring film when using the electrolytic plating method is not present, either. Therefore, the drawback of conventional electrolytic plating method can be avoided.

In addition, since the resist film serving as the mask for selectively forming the bonding pad is common to the resist film serving as the mask for selectively forming the wiring film, there is also obtained an advantage that a series of processes for selectively forming the resist film can be reduced by one amount.

Other objects and advantages of the invention will become apparent upon reading the following detailed description and appended claims, and upon reference to the accompanying drawings.

BRIEF DESCRIPTION OF THE DRAWINGS

For a more complete understanding of the invention, reference should now be made to the embodiments illustrated in greater detail in the accompanying drawings described below by way of examples of the invention:

FIGS. 5A through 5C are sectional views showing an example of a method for mounting a semiconductor element by using a wiring substrate (lead frame) fabricated according to the method shown in FIG. 3 and FIG. 4, in the order of process;

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DESCRIPTION OF THE PREFERRED EMBODIMENTS

The present invention can be applied not to only a wiring substrate for mounting a semiconductor element of ordinary BGA and CSP types, but also to a wiring substrate for mounting a semiconductor element of BGA and CSP types of wire bonding type. As a first resist film, a liquefied resist THB-30 (JSR), for example, can be used (In that case, THB-DI (JSR) 0.5% tetramethyl ammonium hydroxide is suitable). As a second resist film, a dry film HN.240 (produced by Hitachi Chemical Co. Ltd.), for example, can be used (In that case, a sodium carbonate 1% aqueous solution [with a temperature of 40° C.] is suitable). In the case where the above described liquefied resist THB-30 (JSR) is used as the resist film, removal of the first resist film after the formation of a bump or a pad can be performed by using, for example, THB-SI (JSR) dimethyl sulfoxide+ tetramethyl ammonium hydroxide as an exfoliation agent. In the case where, for example, a dry film HN.240 (produced by Hitachi Chemical Co. Ltd.) is used, removal of the second resist film after formation of the wiring film can be performed by using, for example, a sodium hydroxide 5% aqueous solution (40° C.) as the exfoliation agent. In many cases, the bump or the pad is formed of a gold film. However, other metal, such as palladium, can also be used. The material is not restricted to the gold.

Hereafter, the present invention will be described in detail by referring to an illustrated embodiment. FIGS. 3A through 3F and FIGS. 4G through 4J are sectional views showing a first embodiment of a fabrication method of a wiring substrate for mounting a semiconductor element according to the present invention, in the order of process (A) through (J). In the present embodiment, the present invention has been applied to a wiring substrate (lead frame) for T-BGA.

Figure 1A:
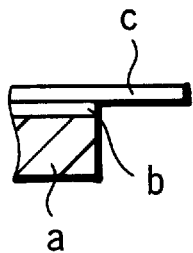
FIGS. 1A through 1D are sectional views showing a prior art example of a fabrication method of a wiring substrate for mounting a semiconductor element, in the order of process.
Figure 1A:
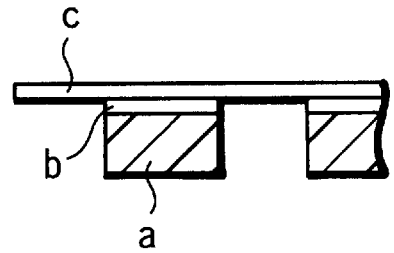
Figure 1B:
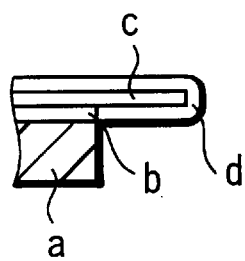
Figure 1B:
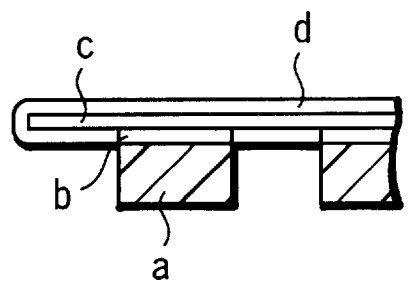
Figure 1C:
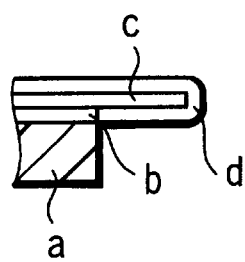
Figure 1C:
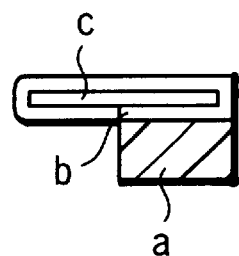
Figure 1D:
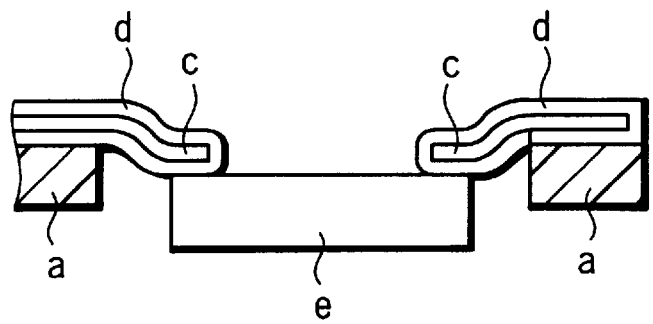
Figure 2A:
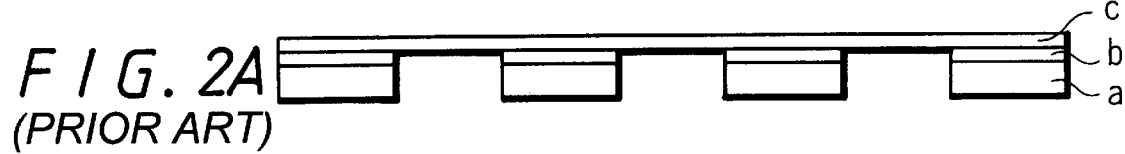
FIGS. 2A through 2C are sectional views showing another prior art example of a fabrication method of a wiring substrate for mounting a semiconductor element, in the order of process.
Figure 2B:
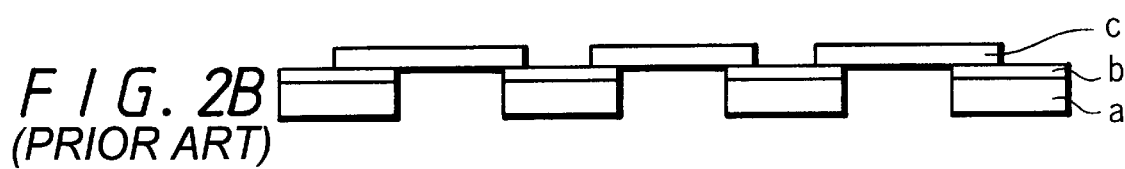
Figure 2C:
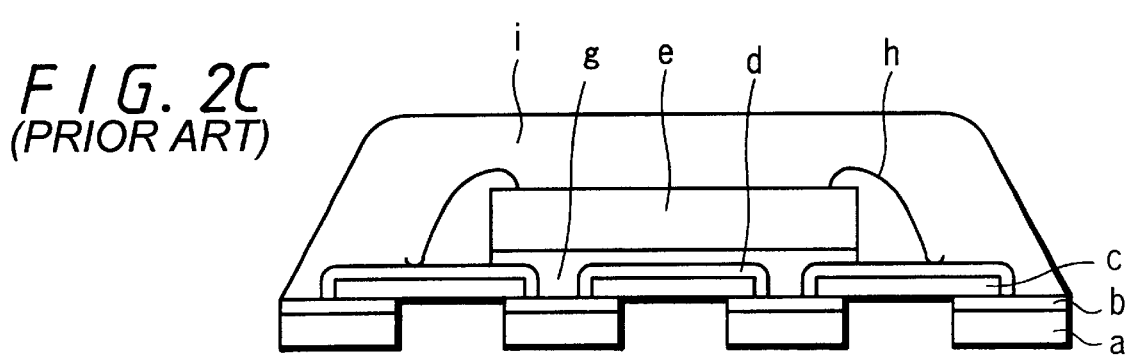
Figure 3A:
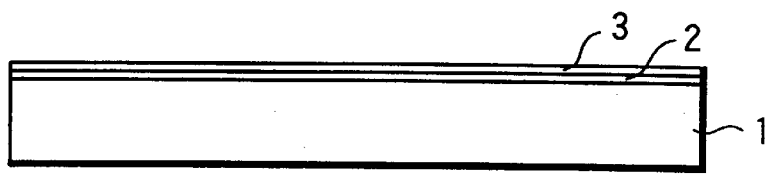
FIGS. 3A through 3F are sectional views showing processes (A) through (F) of a first embodiment of a fabrication method of a wiring substrate for mounting a semiconductor element according to the present invention, in the order of process.

(A) As shown in FIG. 3A, a nickel film 2 (having a thickness of, for example, 2 μm) serving as an etching stopper is formed on the surface of a platelike metal base 1 (having a thickness of, for example, 150 μm) made of a copper alloy. Furthermore, a copper film 3 (having a thickness of, for example, 0.1 μm) serving as a plating underlying film is formed thereon.

Figure 3B:
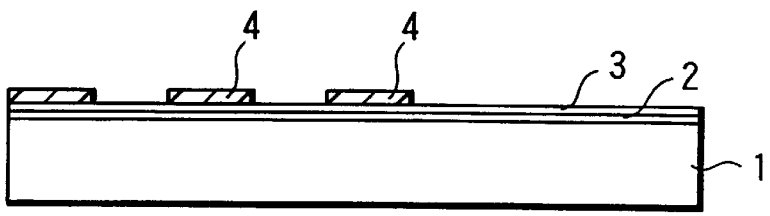

(B) Subsequently, as shown in FIG. 3B, a first resist film 4 made of, for example, a liquefied resist THB-30 (JSR) is selectively formed thereon. Specifically, the first resist film is selectively formed so as to have a negative pattern with respect to a wiring film (7) to be formed later. This selective formation is performed by conducting exposure and development processings after forming the resist film 4 on the whole surface. In the case where the above described liquefied resist THB-30 (JSR) is used as the material of the resist film 4, however, THB-D1 (JSR) 0.5% tetramethyl ammonium hydroxide, for example, is preferably used as a developing solution at the time of the development.

Figure 3C:
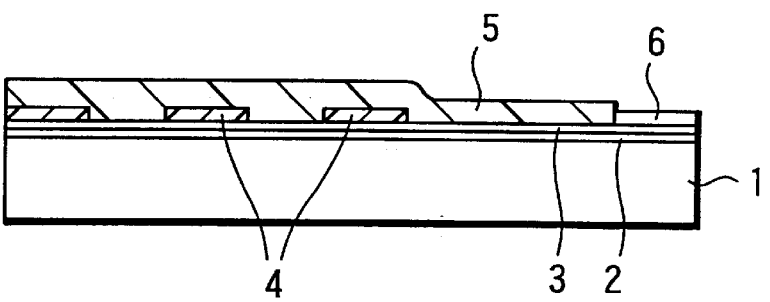

(C) Subsequently, as shown in FIG. 3C, a second resist film 5 made of, for example, a dry film HN.240 (produced by Hitachi Chemical Co. Ltd.) is formed so as to have a negative pattern with respect to a bump (6) to be formed. By conducting electrolytic plating of, for example, gold with the second resist film 5 serving as a mask, a bump 6 (having a thickness, for example, in the range of 2 to 10 μm) is formed. As for the selective formation of the second resist film 5 as well, it is performed by conducting exposure and development processings after forming the resist film on the whole surface. In the case where the above described dry film HN.240 (produced by Hitachi Chemical Co. Ltd.) is used as the material of the resist film 5, a sodium carbonate 1% aqueous solution (with a temperature of 40° C.) is preferably used as a developing solution at the time of the development.

Figure 3D:
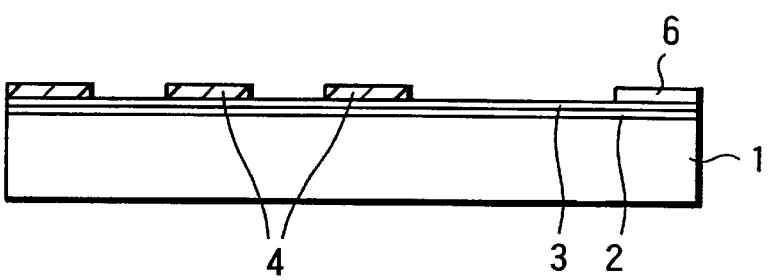

(D) Subsequently, by using a sodium hydroxide about 5% aqueous solution (40° C.) as an exfoliation solution, only the second resist film 5 is removed as shown in FIG. 3D. The first resist film 4 is hardly eroded by this exfoliation solution, and hence remains almost as it is.

Figure 3E:
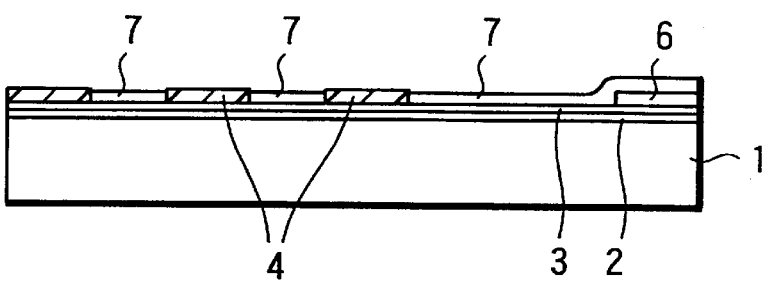

(E) Subsequently, as shown in FIG. 3E, a wiring film 7 (having a thickness, for example, in the range of 25 to 30 μm) is formed by conducting electrolytic plating of, for example, copper with the first resist film 4 serving as the mask.

Figure 3F:
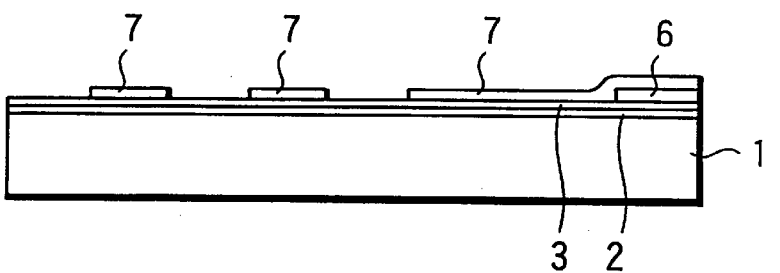

(F) Subsequently, by using THB-SI (JSR) dimethyl sulfoxide+tetramethyl ammonium hydroxide as an exfoliation solution, the first resist film 4 is removed as shown in FIG. 3F.

Figure 4G:
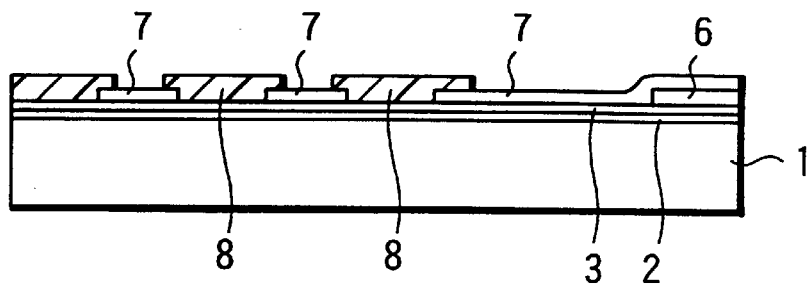
FIGS. 4G through 4J are sectional views showing processes (G) through (J) of the first embodiment of a fabrication method of a wiring substrate for mounting a semiconductor element according to the present invention, in the order of process.

(G) Subsequently, from, for example, polyimide or the like, a resin film 8 (having a thickness of, for example, 25 μm) selectively formed as shown in FIG. 4G. The resin film 8 becomes an insulation base for holding the wiring film 7.

Figure 4H:
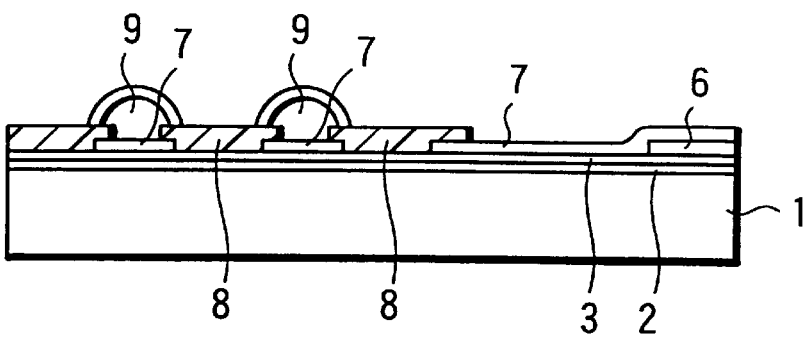

(H) Subsequently, as shown in FIG. 4H, a solder ball electrode 9 is formed. This formation is performed by successively conducting electrolytic plating of nickel plating, gold or nickel, and solder.

Figure 4I:
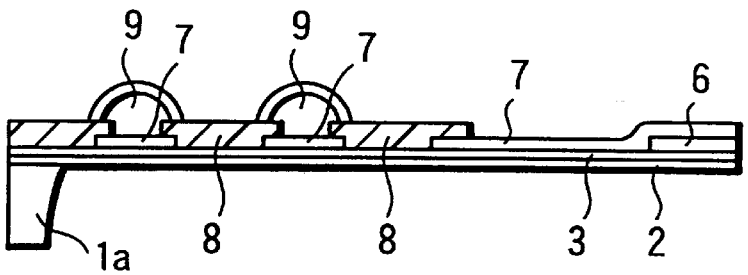

(I) Subsequently, as shown in FIG. 4I, the metal base 1 made of copper is selectively etched from its back surface side. A place thereof corresponding to an area where a large number of pieces of the wiring films 7 have been formed is etched, and only a portion which should become an outer peripheral ring 1a is left. At the time of this etching, the above-mentioned nickel film 2 serves as the etching stopper and prevents the wiring film 7 formed on purpose from being etched.

Figure 4J:
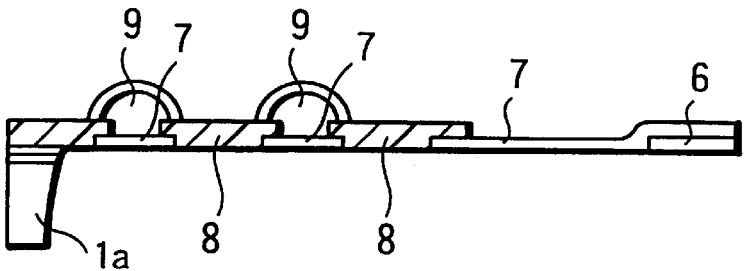

(J) Subsequently, as shown in FIG. 4J, the nickel film 2 and the copper film 3 which have performed the role as the etching stopper are removed by etching. As a result, each of the wiring films 7 is no longer in the electrical conduction state with the other wiring films 7, and becomes electrically independent. The lead frame is thus completed.

FIGS. 5A through 5C are sectional views showing a method for mounting the above described wiring substrate (lead frame) on a semiconductor element, in the order of process. First of all, as shown in FIG. 5A, a bump 6 made of gold located at an inner lead tip end of each wiring film 7 is bonded to each electrode pad 10a of a semiconductor element 10.

Subsequently, as shown in FIG. 5B, a surface portion of the semiconductor element 10 is sealed by resin 11. Thereafter, as shown in FIG. 5C, a stiffener 12 is bonded to back faces of the semiconductor element 10 and the lead frame via an adhesive 13.

According to the present embodiment, in a stage before the wiring film 7 is formed, the plating is conducted to form the bumps 6 by using the first resist film 4 having the negative pattern with respect to the wiring film 7 and the second resist film 5 having the negative pattern with respect to the bumps 6 as the masks. At the time of that plating, therefore, the metal base 1 can be used as the potential transmission means. Without providing a lead circuit for electrolytic plating, therefore, the bump 6 can be formed by the electrolytic plating. Therefore, not only all the drawbacks of the method of forming the bump by using the nonelectrolytic plating can be avoided, but also the necessity of forming the lead circuit for electrolytic plating for providing a potential at every wiring film 7 when using the electrolytic plating method is not present. Therefore, the drawback inherent to the conventional electrolytic plating method can be avoided.

FIGS. 6A through 6F and FIGS. 7G through 7J are sectional views showing a second embodiment of a fabrication method of a wiring substrate for mounting a semiconductor element according to the present invention, in the order of processes (A) through (J). In the present embodiment, the present invention has been applied to a wiring substrate for T-BGA of wire bonding type.

Figure 6A:
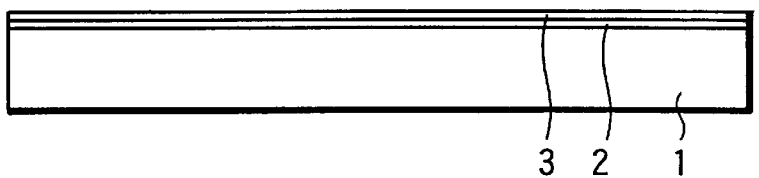
FIGS. 6A through 6F are sectional views showing processes (A) through (F) of a second embodiment of a fabrication method of a wiring substrate for mounting a semiconductor element according to the present invention, in the order of process.

(A) There is prepared a product in which as shown in FIG. 6A, a nickel film 2 (having a thickness of, for example, 2 μm) serving as an etching stopper is formed on the surface of a platelike metal base 1 (having a thickness of, for example, 150 μm) made of a copper alloy, and further, a copper film 3 (having a thickness of, for example, 0.1 μm) serving as a plating underlying film is formed thereon.

Figure 6B:
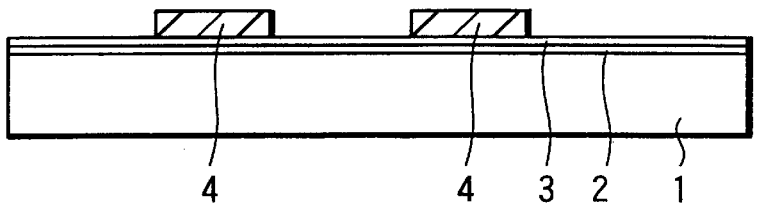

(B) Subsequently, as shown in FIG. 6B, a first resist film 4 made of, for example, a liquefied resist THB-30 (JSR) is selectively formed. Specifically, the first resist film is selectively formed so as to have a negative pattern with respect to a wiring film (7) to be formed later. Development is conducted by using, for example, THB-D1 (JSR) 0.5% tetramethyl ammonium hydroxide as a developing solution.

Figure 6C:
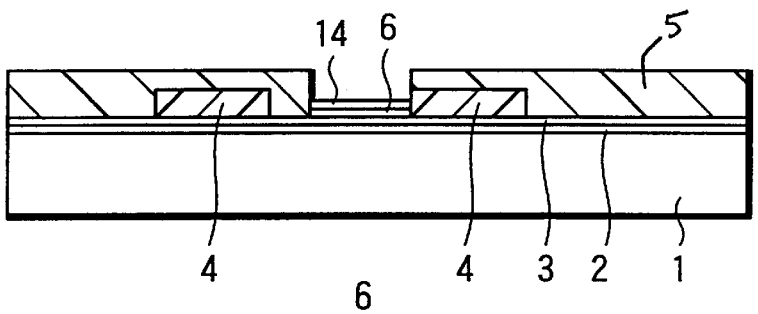

(C) Subsequently, as shown in FIG. 6C, a second resist film 5 made of, for example, a dry film HN.240 (produced by Hitachi Chemical Co. Ltd.) is formed so as to have a negative pattern with respect to a bonding pad (6) to be formed. By conducting electrolytic plating of, for example, gold with the second resist film 5 serving as a mask, a bonding pad 6 (having a thickness, for example, in the range of 2 to 10 $\mu$m) is formed first. Furthermore, by conducting electrolytic plating of, for example, nickel, an ultrasonic vibration spread preventing film 14 (having a film thickness of, for example, 5 $\mu$m) is formed. This ultrasonic vibration spread preventing film 14 functions to prevent ultrasonic vibration applied later when conducting ultrasonic bonding between an electrode of a semiconductor element (10) and the pad 6 of the wiring film 7 by using a wire (16) from spreading and being uncontributive to the wire bonding. As for the development for patterning the second resist film 5, a sodium carbonate 1% aqueous solution (at a temperature of 40° C.), for example, is used as a developing solution.

Figure 6D:
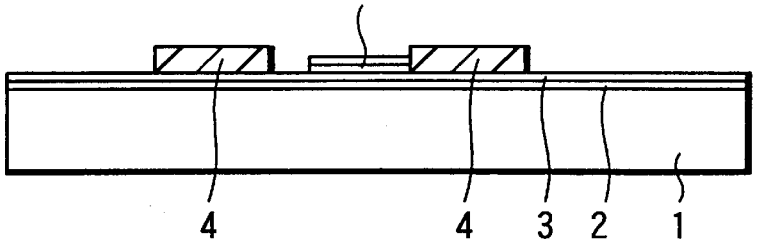

(D) Subsequently, by using a sodium hydroxide about 5% aqueous solution (40° C.) as the exfoliation solution, only the second resist film 5 is removed as shown in FIG. 6D. The above-mentioned first resist film 4 is hardly eroded by this exfoliation solution, and hence remains almost as it is.

Figure 6E:
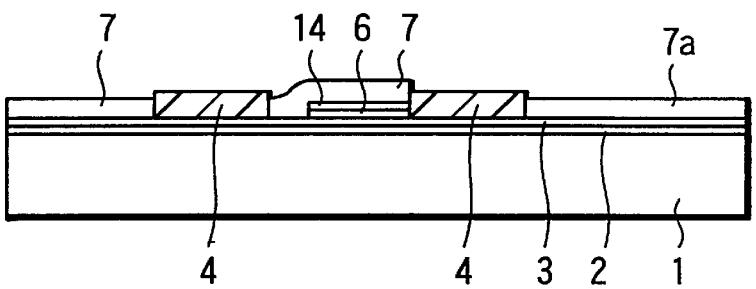
Figure 6F:
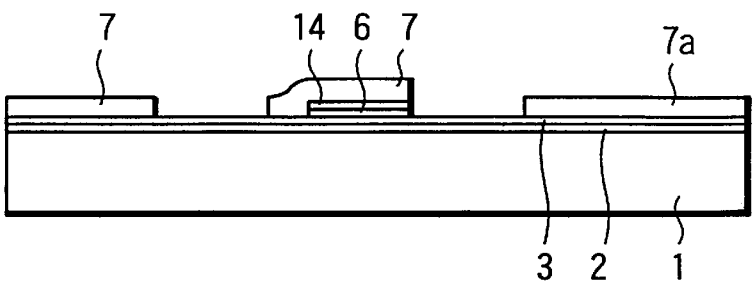

(E) Subsequently, as shown in FIG. 6E, a wiring film 7 (having a thickness, for example, in the range of 25 to 30 $\mu$m) is formed by conducting electrolytic plating of, for example, copper with the first resist film 4 serving as the mask. By the way, 7a denotes a chip bonding area of the wiring film 7 for bonding the semiconductor element (10).

(F) Subsequently, by using THB-SI (JSR) dimethyl sulfoxide+tetramethyl ammonium hydroxide as the exfoliation solution, the first resist film 4 is removed as shown in FIG. 3F.

Figure 7G:
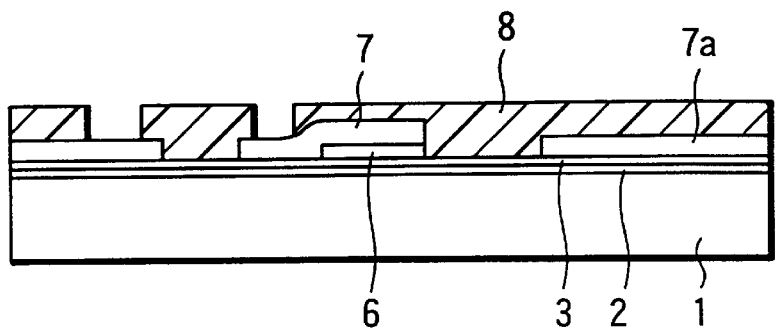
FIGS. 7G through 7J are sectional views showing processes (G) through (J) of the second embodiment of a fabrication method of a wiring substrate for mounting a semiconductor element according to the present invention, in the order of process.

(G) Subsequently, from, for example, polyimide or the like, a resin film 8 (having a thickness of, for example, 25 $\mu$m) is selectively formed as shown in FIG. 7G. The resin film 8 becomes an insulation base for holding the wiring film 7.

Figure 7H:
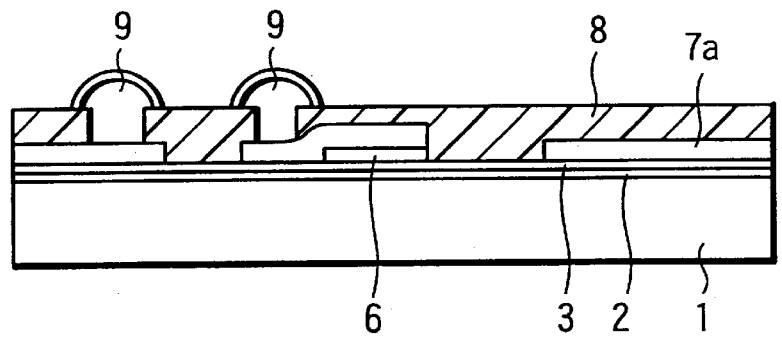

(H) Subsequently, as shown in FIG. 7H, a solder ball electrode 9 is formed. This formation is performed by successively conducting electrolytic plating of nickel plating, gold or nickel, and solder.

Figure 7I:
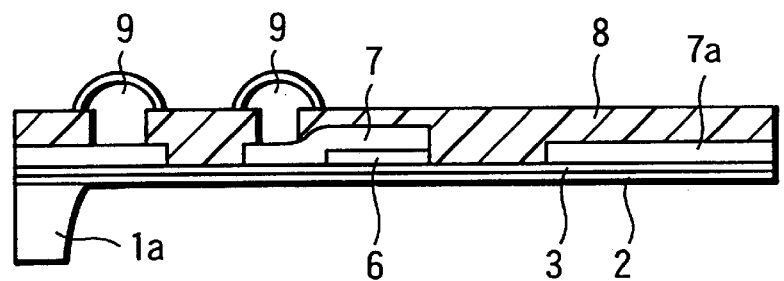

(I) Subsequently, as shown in FIG. 7I, the metal base 1 made of copper is selectively etched from its back surface side. A place thereof corresponding to an area where a large number of pieces of the wiring films 7 have been formed is etched, and only a portion which should become an outer peripheral ring 1a is left. At the time of this etching, the nickel film 2 functions as the etching stopper and prevents the wiring film 7 formed on purpose from being etched.

Figure 7J:
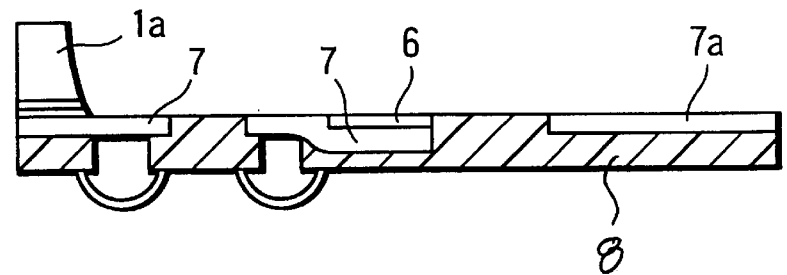

(J) Subsequently, as shown in FIG. 7J, the nickel film 2 and the copper film 3 which have already performed the role as the etching stopper are removed by etching. As a result, each wiring film 7 is no longer in the electrical conduction state with the other wiring film 7, and becomes electrically independent. The lead frame is thus completed. The surface where each wiring film 7 of lead frame (inclusive of 7a) is exposed becomes the surface on which a semiconductor element is mounted.

Figure 8A:
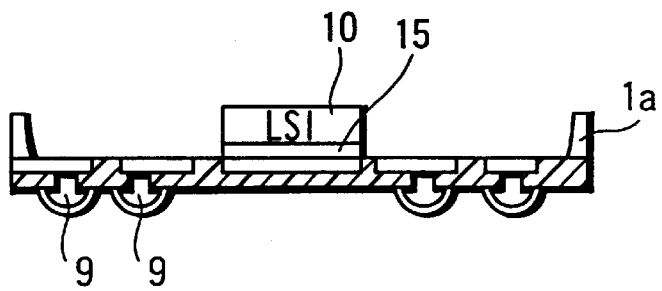
FIGS. 8A through 8D are sectional views showing an example of a method for mounting a semiconductor element by using a wiring substrate (lead frame) fabricated according to the method shown in FIGS. 6 and 7, in the order of process.
Figure 8B:
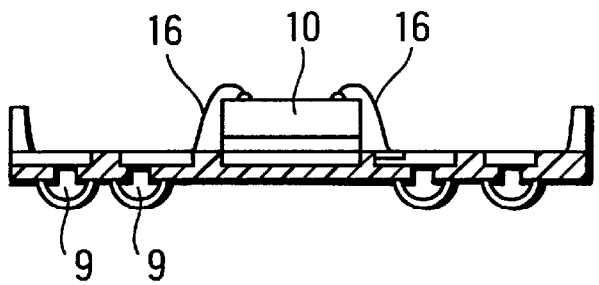

FIGS. 8A through 8D are sectional views showing an example of a method for mounting a semiconductor element by using the lead frame fabricated by the method shown in FIGS. 6 and 7, in the order of process. The method will now be described by referring to FIG. 8. First of all, as shown in FIG. 8A, a semiconductor element 10 is chip-bonded to the chip bonding area 7a of the wiring film 7. Reference numeral 16 denotes an adhesive. Subsequently, as shown in FIG. 8B, connection between electrodes of the semiconductor element 10 and the bonding pads 6 of the wiring film 7 is conducted by means of wire bonding. Reference numeral 16 denotes its wire. This wire bonding is conducted by using the ultrasonic bonding. At that time, the ultrasonic vibration spread preventing film 14 prevents ultrasonic vibration from spreading and contributes to the favorable wire bonding as described above.

Figure 8C:
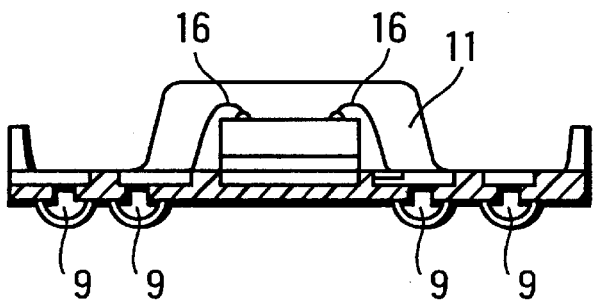
Figure 8D:
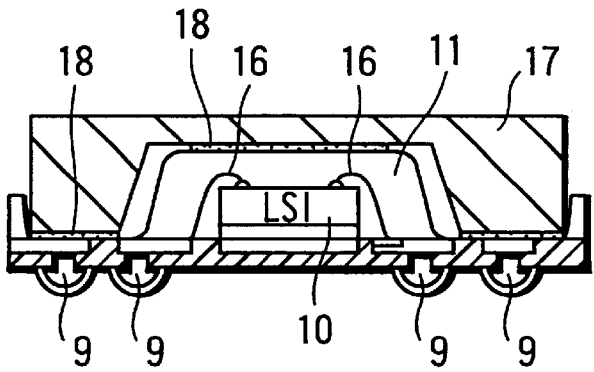

Thereafter, as shown in FIG. 8C, the semiconductor element 10 and the wires 16 described above are sealed by resin 11. Thereafter, as shown in FIG. 8D, a stiffener 17 serving also as a heat spreader is bonded to the sealing resin 11 and the lead frame via an adhesive 18.

In the present embodiment as well, the same effects brought about in the above described first embodiment can be brought about.

FIGS. 9A through 9D and FIGS. 10E through 10G show a third embodiment of a fabrication method of a wiring substrate for mounting a semiconductor element according to the present invention, in the order of process (A) through (G). In the present embodiment, the present invention has been applied to a wiring substrate (lead frame) for T-CSP of wire bonding type.

Figure 9A:
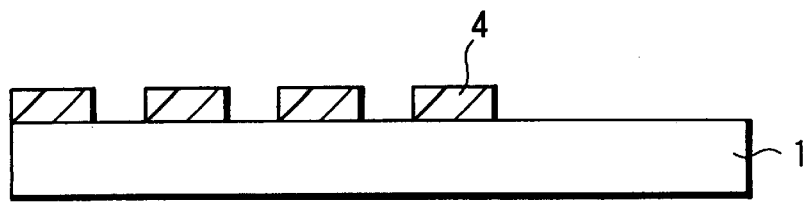
FIGS. 9A through 9D are sectional views showing processes (A) through (D) of a third embodiment of a fabrication method of a wiring substrate for mounting a semiconductor element according to the present invention, in the order process.

(A) As shown in FIG. 9A, a platelike metal base 1 (having a thickness of, for example, 150 $\mu$m) made of a copper alloy is prepared. On its surface, a resist film 4 is selectively formed. Specifically, the resist film is formed selectively so as to have a negative pattern with respect to a wiring film (7) to be formed later. As the metal base 1, the metal base having, a nickel film, for example, (of 2 $\mu$m in thickness) formed entirely on the surface thereof serving as an etching stopper may be used.

Figure 9B:
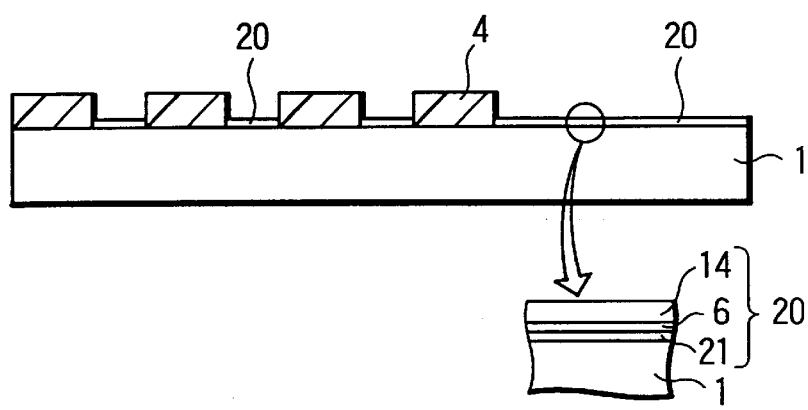

(B) Subsequently, as shown in FIG. 9B, a plating film 20 is formed on the surface of the metal base 1 by electrolytic plating while using the resist film 4 as a mask. As shown in a lower right part of FIG. 9B, this plating film 20 has a three-layer structure including a nickel film 21 serving as an etching stopper, a gold film 6 serving as a bonding pad (where the gold film 6 in the present embodiment is formed on the surface of entire wiring film, and the present embodiment is different from the second embodiment in this point), and a nickel film 14 serving as an ultrasonic vibration spread preventing film. Therefore, this plating film 20 is obtained by conducting electrolytic plating with the resist film 4 serving as the mask three times in the order of nickel, gold, and nickel. In the case where the metal base having a nickel film serving as the etching stopper formed on the whole surface thereof is used as the metal base 1, the nickel film 21 need not be formed.

Figure 9C:
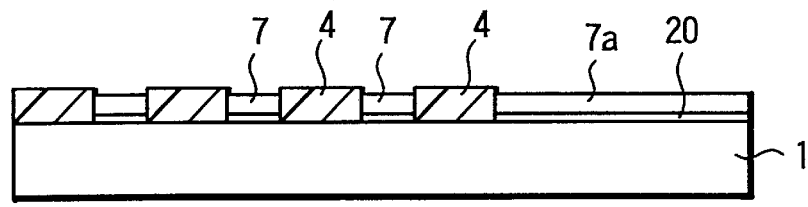

(C) Subsequently, as shown in FIG. 9C, a wiring film 7 (having a thickness, for example, in the range of 25 to 30 μm) is formed by conducting electrolytic plating of, for example, copper with the first resist film 4 serving as the mask. By the way, 7a denotes a chip bonding area of the wiring film 7 for bonding the semiconductor element (10).

Figure 9D:
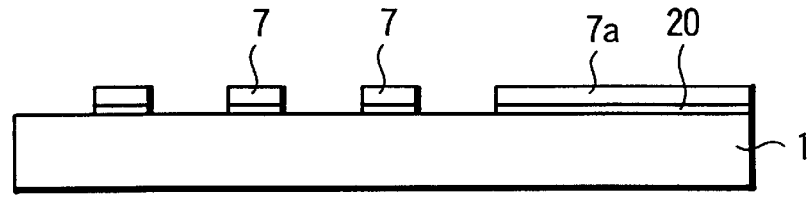

(D) Next, the resist film 4 is removed as shown in FIG. 9D.

Figure 10E:
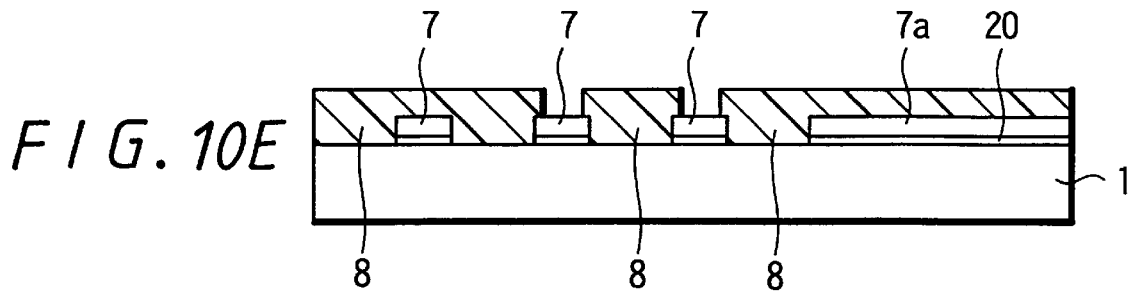
FIGS. 10E through 10G are sectional views showing processes (E) through (G) of the third embodiment of a fabrication method of a wiring substrate for mounting a semiconductor element according to the present invention, in the order of process.

(E) Subsequently, from, for example, polyimide or the like, a resin film (having a thickness of, for example, 25 μm) 8 is selectively formed as shown in FIG. 10E. The resin film 8 becomes an insulation base for holding the wiring film 7.

Figure 10F:
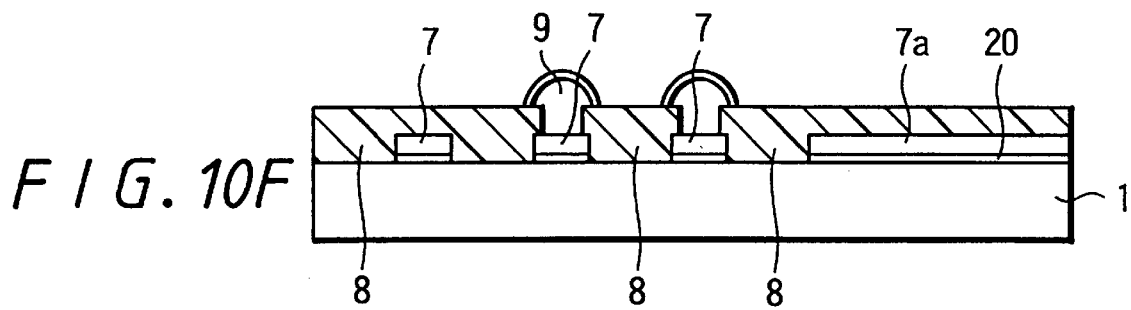

(F) Subsequently, as shown in FIG. 10F, a solder ball electrode 9 is formed. This formation is performed by successively conducting electrolytic plating of nickel plating, gold or nickel, and solder.

(G) Subsequently, the metal base 1 made of copper is selectively etched from its back surface side. A place thereof corresponding to an area where a large number of wiring films 7 have been formed is etched, and only a portion which should become an outer peripheral ring 1a is left. At the time of this etching, the nickel film 21 functions as the etching stopper and prevents the wiring film 7 formed on purpose from being etched.

Figure 10G:
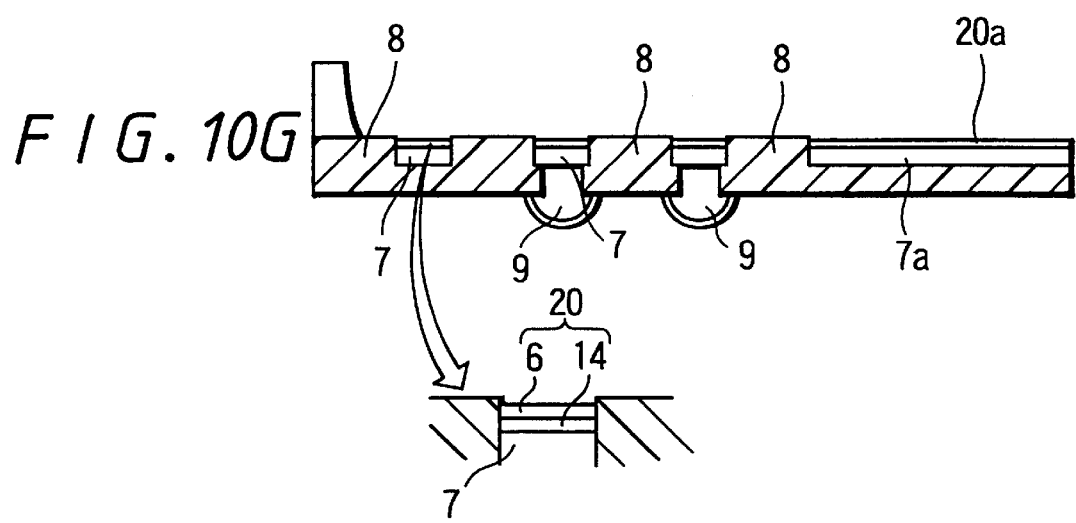

Subsequently, as shown in FIG. 10G, the nickel film 21 which has performed the role as the etching stopper is removed by etching. As a result, the gold film 6 on the surface of each of the wiring films 7 is exposed and it can perform the role as the bonding pad. In the case where the metal base having a nickel film serving as the etching stopper formed on the whole surface thereof is used as the metal base 1, removing the nickel film functions not only to expose the gold film 6 but also to electrically separate each of the wiring films 7 from the other wiring film 7 and make each of the wiring film 7 independent from the other wiring film. The lead frame is thus in the completed state. The surface where each wiring film 7 (7a) of the lead frame is exposed becomes the side surface on which a semiconductor element is mounted.

The present embodiment is different from the first and second embodiments in that the selective formation of the gold film 6 serving as the bonding pad is conducted by using the resist film 4 used as the mask in selective formation of the wiring film 7 as it is. However, the point that the metal base 1 can be used as the potential transmission means at the time of plating is completely common to the present embodiment and the first and second embodiments. Without providing a lead circuit for electrolytic plating, the pad 6 can be formed by the electrolytic plating. Therefore, all the drawbacks of the method of forming the bump 6 by the nonelectrolytic plating can be completely avoided. In addition, in common with the first and second embodiments, the effect that unlike the electrolytic plating method it is not necessary to form the lead circuit for electrolytic plating to provide a potential at every wiring film 7 can be brought about. Therefore, the drawback inherent to the conventional electrolytic plating method can be avoided. In addition, since the resist film serving as the mask for selectively forming the bonding pad 6 is common to the resist film serving as the mask for selectively forming the wiring film, a series of processes for selectively forming the resist film can be advantageously reduced by one amount.

Figure 11A:
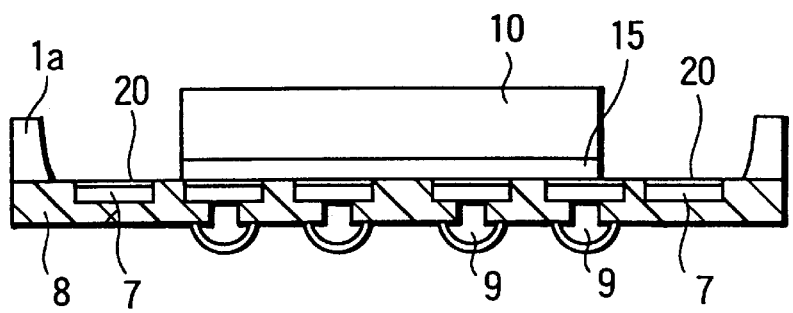
FIGS. 11A through 11C are sectional views showing an example of a method for mounting a semiconductor element by using a wiring substrate (lead frame) fabricated according to the method shown in FIGS. 9 and 10, in the order of process.
Figure 11B:
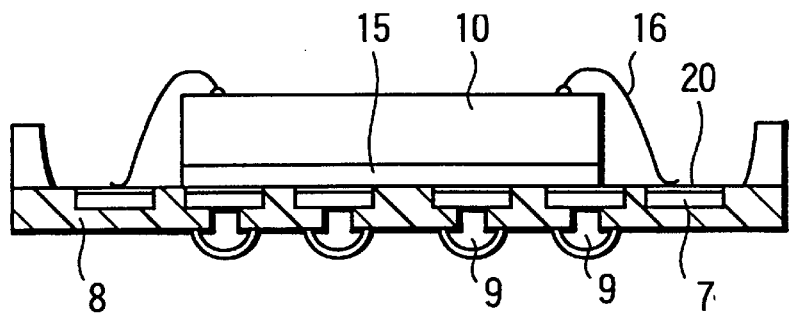
Figure 11C:
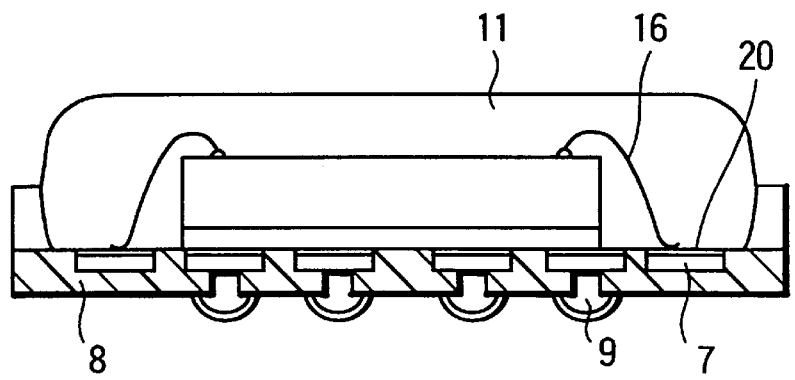

FIGS. 11A through 11C are sectional views showing an example of a method for mounting a semiconductor element by using the wiring substrate (lead frame) fabricated by the method shown in FIGS. 9 and 10, in the order of process. The method will now be described by referring to FIG. 11.

First of all, as shown in FIG. 11A, a semiconductor element 10 is subjected to chip bonding. Numeral 15 denotes an adhesive. Subsequently, as shown in FIG. 11B, connection between electrodes of the semiconductor element 10 and the bonding pads 6 of the wiring film 7 is conducted by means of wire bonding. 16 denotes its wire. This wire bonding is conducted by using the ultrasonic bonding. The nickel film 14 performs the role of preventing ultrasonic vibration from spreading as described above.

Thereafter, as shown in FIG. 11C, the semiconductor element 10 and the wires 16 are sealed by resin 11.

Figure 12:
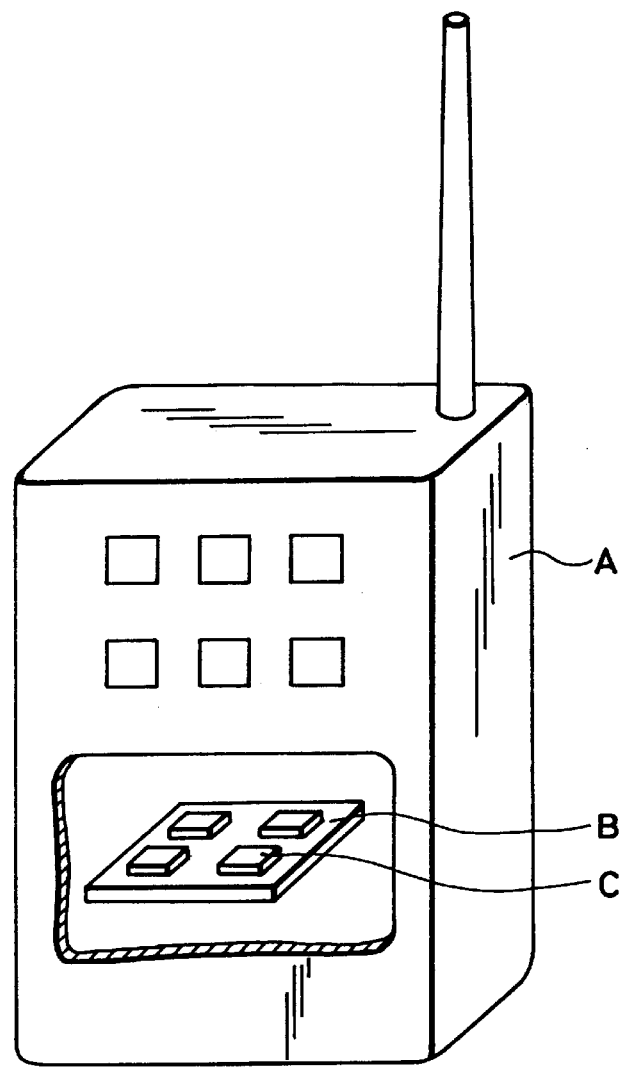
FIG. 12 is a perspective view of a portable telephone with a part being cut away to show its inside.

A semiconductor device C, in which a semiconductor element is mounted on the wiring substrate manufacturing by the fabrication method of the present invention described above, is mounted in an electronic appliance such as, for example, a portable telephone A, which is shown in FIG. 12, or the like. The semiconductor device C constitutes at least a part of an internal circuit of the portable telephone A.

As shown in FIG. 12, the above-mentioned semiconductor device C is mounted on a mother board B within the portable telephone A.

Figure 13:
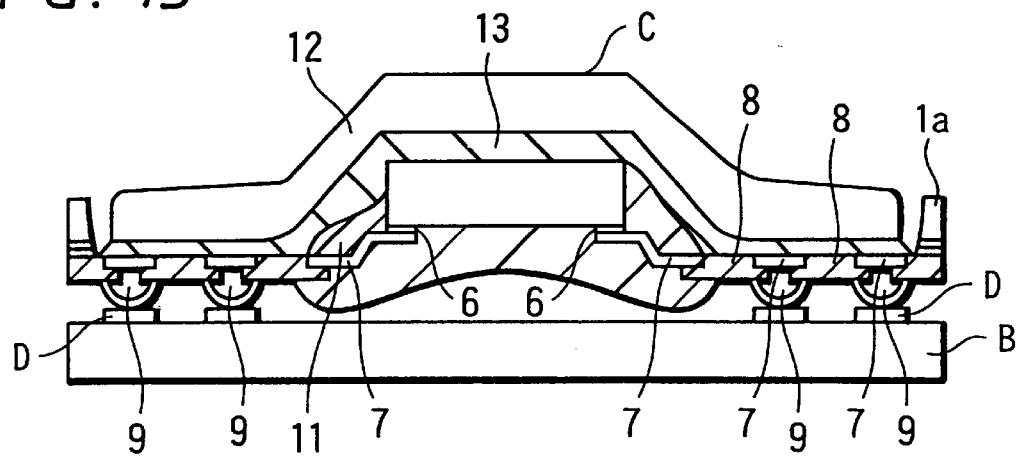
FIG. 13 is a schematic sectional view showing a connection state between a mother board in a portable telephone and a semiconductor device of the present invention.

As shown in FIG. 13, electrodes D of the mother board B are electrically connected to the external electrode 9 of the semiconductor device C, respectively.

According to the fabrication method for a wiring substrate and the semiconductor device of the present invention, a small-sized semiconductor device having a fine pitch can be manufactured accurately and satisfactorily. Thus, if such device is employed in an electronic appliance, it is possible to make the electronic appliance small in size.

According to the fabrication method of the wiring substrate for mounting a semiconductor element according to claim 1, in a stage before the wiring film is formed, plating is conducted by using the resist film having a negative pattern with respect to the wiring film and the resist film having a negative pattern with respect to the bumps or pads as masks, and thereby the bumps or pads are formed. At the time of that plating, therefore, the metal base can be used as the potential transmission means. Without providing a lead circuit for electrolytic plating, therefore, the bumps or pads can be formed by the electrolytic plating. Therefore, all drawbacks of the method of forming the bumps or pads by using the nonelectrolytic plating can be avoided. In addition, the necessity of forming the lead circuit for electrolytic plating for providing a potential at every wiring film when using the electrolytic plating method is not present, either. Therefore, the drawback inherent to the conventional electrolytic plating method can be avoided.

According to the fabrication method of the wiring substrate for mounting a semiconductor element according to claim 2, the resist film formed as the mask for selectively forming the wiring film is used as the mask for selectively forming the bumps or pads as well. Both the formation of the bumps or pads and formation of the wiring film are conducted in such a state that the metal base is completely present. At the time of that plating, therefore, the metal base can be used as the potential transmission means. Without providing a lead circuit for electrolytic plating, therefore, the bumps or pads can be formed by the electrolytic plating. Therefore, all drawbacks of the method of forming the bumps or pads by using the nonelectrolytic plating can be avoided. In addition, the necessity of forming the lead circuit for electrolytic plating for providing a potential at every wiring film when using the electrolytic plating method is not present, either. Therefore, the drawback inherent to the conventional electrolytic plating method can be avoided.

In addition, since the resist film serving as the mask for selectively forming the bonding pads 6 is common to the resist film serving as the mask for selectively forming the wiring film, there is also obtained an advantage that a series of processes for selectively forming the resist film can be reduced by one amount.

According to a fabrication method of a wiring substrate for mounting a semiconductor element according to claim 3, the metal base having the etching stop film on the surface thereof is used as the metal base. After the wiring film the and the bumps or pads are formed, therefore, it is possible to prevent erosion of the wiring film by the etching stop film at the time of etching for etching the metal base from its back surface and thereby removing unnecessary parts of the metal base. And by removing the etching stop film after the etching, such a state that all the wiring films are electrically connected to one another by the etching stop film is eliminated. In other words, each of the wiring films can be made electrically independent, and furthermore, the pads or bumps can be exposed.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A fabrication method of a wiring substrate for mounting a semiconductor element, characterized by comprising the steps of:

providing a metal base, the metal base having a surface;

forming a resist film on the surface of the metal base, the resist film having a negative pattern with respect to a wiring film to be subsequently formed;

forming an etching stop layer on the metal base using the resist film as a mask;

after forming the etching stop layer, forming a bump by electrolytic plating on the surface of the etching stop layer using the resist film as a mask;

forming the wiring film by electrolytic plating on the bump and on the surface of the metal base using the resist film as a mask;

after forming the wiring film, removing an unnecessary portion of the etching stop layer by etching while using the etching stop layer as an etching stop;

after removing the unnecessary portion of the metal base, removing an unnecessary portion of the etching stop layer by etching to thereby expose the bump.

2. The method of claim 1 wherein the bump is further characterized as a pad.

3. The method of claim 1 further comprising the following steps after the step of forming the wiring film:

selectively forming an insulating film on the wiring film to cover the wiring film and to form an opening for partially exposing the wiring film; and forming an external electrode in the opening.

4. The method of claim 1 wherein the metal base comprises a plurality of layers including at least a first metal layer and a second metal layer, the second metal layer serving as an etching stop layer laminated on the first metal layer, the resist film, the bump and the wiring film being formed on the second metal layer, the method further comprising the following steps after the step of forming the wiring film:

removing an unnecessary portion of the first metal layer by etching from a side of the first metal layer opposite the second metal layer thereby using the second metal layer as an etching stop layer;

removing an unnecessary portion of the second metal layer by etching to thereby isolate portions of the wiring film from one another.

5. The method of claim 4 wherein the first metal layer is made of copper.

6. The method of claim 4 wherein the second metal layer is made of nickel.

7. The method of claim 1 further comprising the following step:

electrically connecting the bump to an electrode of a semiconductor element.

* * * * *